United States Patent
Yokoyama et al.

(10) Patent No.: US 9,583,409 B2
(45) Date of Patent: Feb. 28, 2017

(54) RESIN SEALED MODULE

(71) Applicant: Murata Manufacturing Co., Ltd., Kyoto-fu (JP)

(72) Inventors: Yasuo Yokoyama, Kyoto (JP); Tetsuya Kitaichi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 103 days.

(21) Appl. No.: 13/940,373

(22) Filed: Jul. 12, 2013

(65) Prior Publication Data

US 2013/0300002 A1    Nov. 14, 2013

Related U.S. Application Data

(63) Continuation of application No. PCT/JP2012/050326, filed on Jan. 11, 2012.

(30) Foreign Application Priority Data

Jan. 12, 2011   (JP) ................. 2011-003940

(51) Int. Cl.
*H01L 23/28* (2006.01)
*H01L 23/00* (2006.01)
(Continued)

(52) U.S. Cl.
CPC .......... *H01L 23/28* (2013.01); *H01L 23/3135* (2013.01); *H01L 23/562* (2013.01);
(Continued)

(58) Field of Classification Search
CPC ......... H01L 23/48; H01L 23/12; H01L 23/28; H01L 23/3135; H01L 23/562;
(Continued)

(56) References Cited

U.S. PATENT DOCUMENTS

2009/0091021 A1*  4/2009  Nakamura ............ H01L 21/563
                                                              257/707
2009/0096080 A1*  4/2009  Mikami ................ H01L 24/50
                                                              257/690

(Continued)

FOREIGN PATENT DOCUMENTS

CN       101232775 A    7/2008
JP       2000-012577 A  1/2000
(Continued)

OTHER PUBLICATIONS

Office Action issued in Japanese Patent Application No. 2012-552735 dated Mar. 17, 2015.

(Continued)

*Primary Examiner* — Jarrett Stark
*Assistant Examiner* — Shahed Ahmed
(74) *Attorney, Agent, or Firm* — Pearne & Gordon LLP

(57) ABSTRACT

A resin-sealed module is provided which reduces the warpage of a substrate and the detachment between a sealing resin and the substrate which occur during re-reflow, has the excellent flatness of the top and bottom surfaces, and reduces the occurrence of the short failures. A resin layer made of a thermoplastic resin is arranged on top of a substrate, and a resin layer made of a thermosetting resin is arranged on top of this resin layer, thereby reducing the warpage of the substrate and the detachment between the sealing resin and the substrate which occur during re-reflow.

3 Claims, 3 Drawing Sheets

(51) Int. Cl.
  *H01L 23/31* (2006.01)
  *H01L 25/16* (2006.01)

(52) U.S. Cl.
  CPC .......... *H01L 23/3121* (2013.01); *H01L 25/16* (2013.01); *H01L 2224/131* (2013.01); *H01L 2224/16238* (2013.01); *H01L 2924/18161* (2013.01)

(58) Field of Classification Search
  CPC ..... H01L 2224/131; H01L 2224/16238; H01L 23/3121; H01L 25/16; H01L 2924/18161
  USPC ........ 257/787, 690, E23.169, 788, 789, 790, 257/795; 438/106, 112, 124, 126, 127
  See application file for complete search history.

(56) References Cited

U.S. PATENT DOCUMENTS

| | | | | |
|---|---|---|---|---|
| 2010/0027225 | A1* | 2/2010 | Yuda | H05K 1/141 361/736 |
| 2010/0032826 | A1* | 2/2010 | Tachibana | C08L 63/00 257/692 |
| 2010/0246144 | A1* | 9/2010 | Yamazaki | H01L 23/13 361/749 |
| 2013/0107482 | A1* | 5/2013 | Inagaki | H01G 4/224 361/763 |
| 2014/0247572 | A1 | 9/2014 | Inagaki | |

FOREIGN PATENT DOCUMENTS

| | | |
|---|---|---|
| JP | 2000-114431 A | 4/2000 |
| JP | 2001-308230 A | 11/2001 |
| JP | 2004-014871 A | 1/2004 |
| JP | 2005-012089 A | 1/2005 |
| JP | 2005-072187 A | 3/2005 |
| JP | 2006-041071 A | 2/2006 |
| JP | 2006-120838 A | 5/2006 |
| JP | 2007-042829 A | 2/2007 |
| JP | 2010-109246 A | 5/2010 |
| JP | 2010-283215 A | 12/2010 |

OTHER PUBLICATIONS

Written Opinion of the International Searching Authority for PCT/JP2012/050326 dated Apr. 3, 2012.
International Search Report for PCT/JP2012/050326 dated Apr. 3, 2012.
Office Action issued in corresponding Japanese Patent Application No. 2012-552735 dated Aug. 4, 2015.

* cited by examiner

RESIN SEALED MODULE

BACKGROUND OF THE INVENTION

Field of the Invention

The present invention relates to a resin-sealed module in which electronic components are sealed with the resin.

Description of the Related Art

As a resin-sealed module according to the related art, for example, a module described in Patent Document 1 is known. Hereinafter, the resin-sealed module described in Patent Document 1 will be illustrated with reference to FIG. 3. FIG. 3 is a cross-sectional view of the resin-sealed module.

A resin-sealed module 100 includes an insulating substrate 101, and a sealing resin layer 103 made of a thermosetting resin. An IC chip 104 and an electronic component 105 mounted onto the insulating substrate 101 as described below are embedded in the sealing resin layer 103. A wiring conductor 102 is formed on the insulating substrate 101. The IC chip 104 is electrically connected to the wiring conductor 102 by a solder bump 106. An electrode terminal 107 of the electronic component 105 is electrically connected to the wiring conductor 102.

Patent Document 1: Japanese Unexamined Patent Application Publication No. 2007-042829

BRIEF SUMMARY OF THE INVENTION

In the resin-sealed module 100 mentioned above, the sealing resin layer 103 that contacts the substrate 101 is made of a thermosetting resin. Therefore, there is a possibility that during the re-reflow for mounting the resin-sealed module 100 onto another substrate or the like, warpage occurs in the insulating substrate 101 owing to a difference in the thermal expansion coefficient between the insulating substrate 101 and the sealing resin layer 103. There is also a possibility that during the re-reflow, the solder bump 106 joining the insulating substrate 101 and the IC chip 104 melts and expands, and the resulting stress causes the detachment between the sealing resin layer 103 and the IC chip 104, or between the sealing resin layer 103 and the insulating substrate 101. There is a possibility that a short failure occurs as a result.

In view of the above-mentioned circumstances, it is an object of the present invention to provide a resin-sealed module whose resin layer arranged on top of a substrate is formed by two resin layers including a resin layer made of a thermoplastic resin and a resin layer made of a thermosetting resin, thereby reducing the warpage of the substrate, and the detachment between the resin layer and an electronic component or between the resin layer and the substrate which may occur during re-reflow.

A resin-sealed module according to the present invention includes a substrate that includes an external electrode, an electronic component that is arranged on top of the substrate, and mounted onto the substrate by a solder, a first resin layer that is arranged on top of the substrate, and in which at least the solder is embedded, the first resin layer being made of a thermoplastic resin containing an inorganic filler, and a second resin layer that is arranged on top of the first resin layer, the second resin layer being made of a thermosetting resin containing an inorganic filler.

Because the resin layer that contacts the substrate is made of a thermoplastic resin, when the substrate undergoes thermal expansion during the re-reflow for mounting this resin-sealed module onto another substrate or the like, the warpage of the substrate can be reduced by softening of the resin layer.

Because the resin layer made of a thermosetting resin is provided on top of the resin layer made of a thermoplastic resin, it is possible to reduce the softening and the flowing of the thermoplastic resin during the re-reflow, thereby keeping the shape of the resin layer. Further, because the resin layer made of a thermoplastic resin is covered by the resin layer made of a thermosetting resin, its laser printability is not impaired.

In the resin-sealed module according to the present invention, a softening temperature of the thermoplastic resin that forms the first resin layer is preferably equal to or lower than a melting point of the solder.

In this case, the solder portion joining the substrate and the electronic component is sealed with the resin layer made of a thermoplastic resin. Therefore, even if the solder melts and expands and stress occurs during the re-reflow, the resin layer that has softened makes it possible to relieve the stress. As a result, it is possible to reduce the detachment between the resin layer and the substrate, and between the resin layer and the substrate.

According to the present invention, the resin layer that contacts the substrate is made of a thermoplastic resin. Therefore, when the substrate undergoes thermal expansion during the re-reflow for mounting this resin-sealed module onto another substrate or the like, the warpage of the substrate can be reduced by the softening of the resin layer.

DETAILED DESCRIPTION OF THE INVENTION

Figure 1:
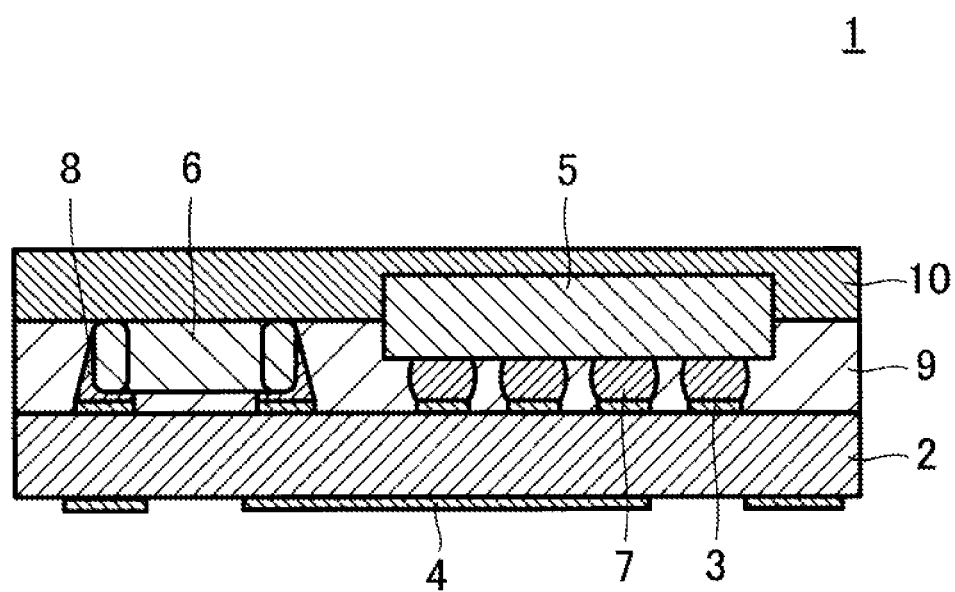
FIG. 1 is a schematic view illustrating the cross-section of a resin-sealed module according to an embodiment of the present invention.
Figure 2:
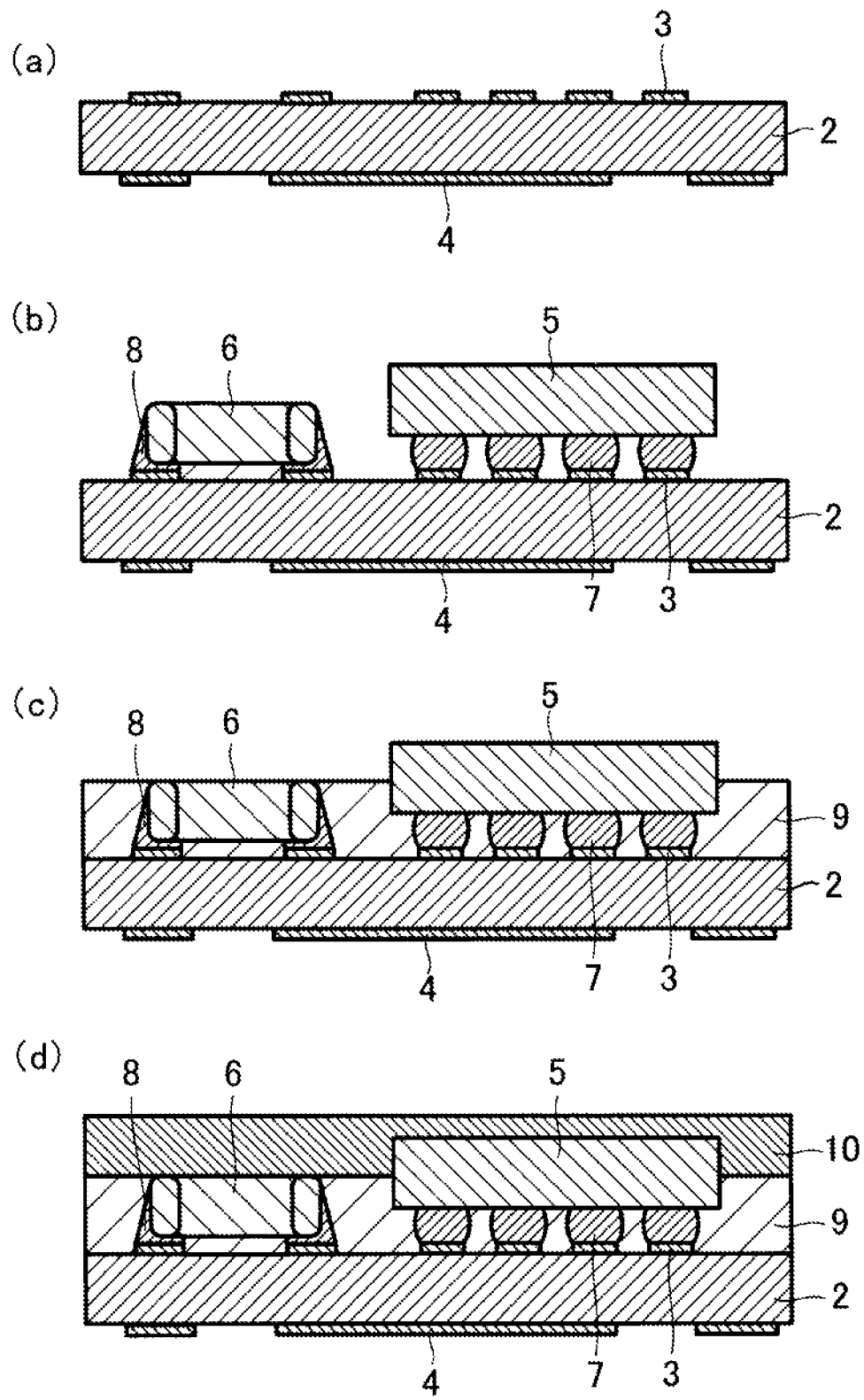
FIG. 2 is a cross-sectional view illustrating a manufacturing method for the resin-sealed module according to the embodiment of the present invention.
Figure 3:
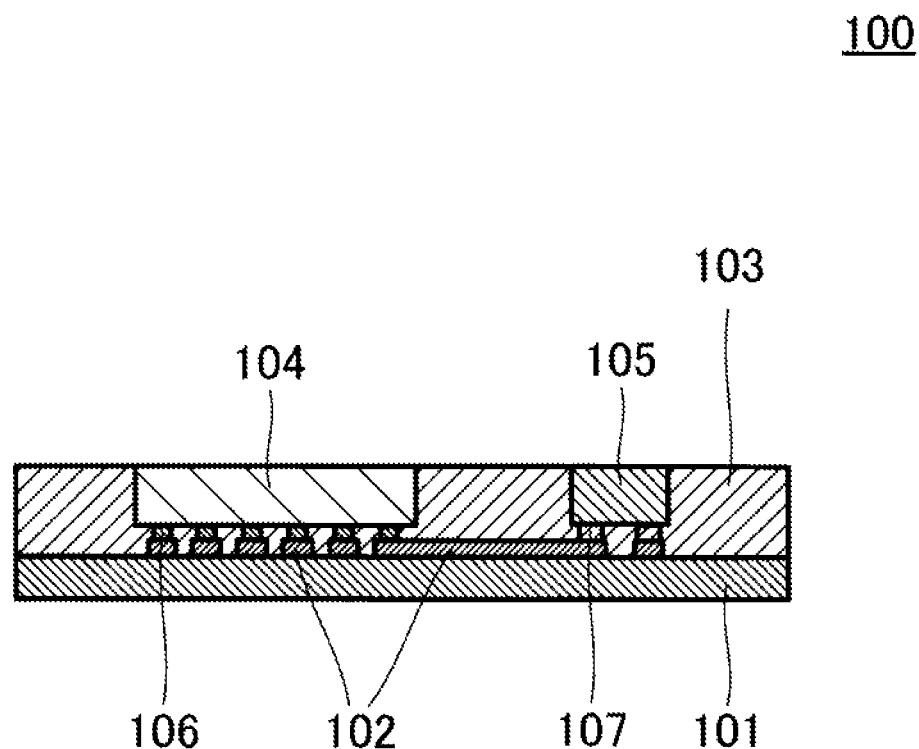
FIG. 3 is a schematic view illustrating the cross-section of a resin-sealed module according to the related art.

Hereinafter, a resin-sealed module according to an embodiment of the present invention will be illustrated with reference to FIG. 1 and FIG. 2.

A resin-sealed module 1 includes a substrate 2, a first resin layer 9, and a second resin layer 10.

The substrate 2 is made of a glass epoxy resin. The substrate 2 has an external electrode 4, and a land 3 that are formed on the bottom surface and a surface opposite to the bottom surface, respectively.

The first resin layer 9 is made of a thermoplastic resin such as an acrylic resin containing an inorganic filler made of $SiO_2$. The softening temperature of this thermoplastic resin is 100° C. to 200° C. The first resin layer 9 is arranged on the surface of the substrate 2 on which the land 3 is formed. An IC 5 and a capacitor 6 are embedded in the first resin layer 9. The IC 5 is connected to the land 3 formed on the substrate 2 by a solder bump 7. The capacitor 6 is connected to the land 3 by a solder 8.

The second resin layer 10 is made of a thermosetting resin such as an epoxy resin containing an inorganic filler made of $SiO_2$. The second resin layer 10 is arranged on the surface of the first resin layer 9 opposite to the substrate 2.

Since the reflow temperature during the re-reflow for mounting the resin-sealed module 1 onto another substrate or the like is 220° C. to 260° C., the substrate 2 thermally expands beyond its glass transition temperature to elongate mainly in the direction of its plane. Because the first resin layer 9 that contacts the substrate 2 is made of a thermoplastic resin, and its softening temperature is 100° C. to 200° C., the first resin layer 9 softens during the re-reflow. Because the first resin layer 9 softens, the elongation of the substrate 2 is hardly transmitted to the first resin layer 9. As a result, it is possible to reduce the warpage of the substrate 2.

The melting point temperature of each of the solder bump 7 and the solder 8 sealed with the first resin layer 9 is approximately 220° C. As described above, the softening temperature of the first resin layer 9 is 100° C. to 200° C. Therefore, when the solder bump 7 and the solder 8 melt and expand and stress occurs during the re-reflow, because the first resin layer 9 has already softened, it is possible to relieve the stress generated by the melting and expansion of the solder bump 7 and the solder 8. Consequently, it is possible to prevent the detachment between the substrate 2 and the first resin layer 9, between the solder bump 7 and the first resin layer 9, and between the solder 8 and the first resin layer 9. As a result, it is possible to reduce the short failures.

The second resin layer 10 made of a thermosetting resin is arranged on top of the first resin layer 9. That is, the first resin layer 9 is sandwiched by the second resin layer 10 and the substrate 2. Even if the first resin layer 9 made of a thermoplastic resin softens during the re-reflow, because the first resin layer 9 is sandwiched by the second resin layer 10 and the substrate 2, the flowing of the first resin layer 9 is reduced. Moreover, because the top surface of the resin-sealed module is covered with the second resin layer 10 made of a thermosetting resin, its laser printability is not impaired when printing a product symbol or the like (FIG. 1).

Next, a manufacturing method for the resin-sealed module according to the present invention will be described with reference to FIG. 2. FIG. 2 is a cross-sectional view illustrating the manufacturing steps for the resin-sealed module according to the present invention.

First, the substrate 2 made of a glass epoxy resin having a conductor foil of Cu is prepared. This Cu conductor foil is etched to form the land 3 and the external electrode 4 as desired (FIG. 2(a)).

Next, a solder paste 8 is printed onto a predetermined portion of the land 3 formed on the substrate 2. The capacitor 6 is placed on top of the solder paste 8, and then the IC 5 is placed, followed by mounting by the reflow (FIG. 2(b)).

Next, a thermoplastic acrylic resin or the like is heated and fludized to prepare a liquid resin. This liquid resin contains 40% by weight to 90% by weight of an inorganic filler made of $SiO_2$ for the weight of the liquid resin containing the inorganic filler. This liquid resin is applied onto the substrate 2 by dispensing or the like, and the solder bump 7 and the solder 8 are completely covered by the liquid resin. At this time, the IC 5 and the capacitor 6 may be entirely covered by the liquid resin, or may be only partially covered by the liquid resin. Thereafter, air bubbles within the liquid resin are removed by vacuum degassing or the like, followed by cooling the liquid resin to a temperature equal to or below its melting point. As a result, the liquid resin becomes the first resin layer 9 (FIG. 2(c)).

Next, a liquid resin made of a thermosetting resin such as an epoxy resin is prepared. This liquid resin contains 40% by weight to 90% by weight of an inorganic filer made of $SiO_2$ for the weight of the liquid resin containing the inorganic filler. This liquid resin is applied onto the first resin layer 9 by dispensing or the like so as to completely cover the portions of the IC 5 and capacitor 6 not covered by the first resin layer 9. Thereafter, the second resin layer 10 is formed by heating and setting the liquid resin (FIG. 2(d)).

While the above description is directed to a manufacturing method using a liquid resin made of a thermoplastic resin or thermosetting resin, it is also possible to adopt a manufacturing method using a sheet-like resin containing a filler.

1 resin-sealed module
2 substrate
3 land
4 external electrode
5 IC
6 capacitor
7 solder bump
8 solder
9 first resin layer
10 second resin layer
100 resin-sealed module
101 insulating substrate
102 wiring conductor
103 sealing resin layer
104 IC chip
105 electronic component
106 bump
107 electrode terminal

The invention claimed is:

1. A resin-sealed module comprising:
a substrate including an external electrode;
an electronic component arranged on the substrate, and mounted onto the substrate by a solder;
a first resin layer arranged on the substrate, wherein at least the solder is embedded in the first resin layer, the first resin layer comprises a thermoplastic resin containing an inorganic filler; and
a second resin layer arranged on the first resin layer, wherein the second resin layer comprises a thermosetting resin containing an inorganic filler,
wherein the second resin layer is in contact with the first resin layer, no portion of the second resin layer is in contact with the substrate, and both of the first and second resin layers are exposed at side surfaces of the resin-sealed module.

2. The resin-sealed module according to claim 1, wherein a softening temperature of the thermoplastic resin equal to or lower than a melting point of the solder.

3. The resin-sealed module according to claim 1, wherein the second resin layer is arranged on a surface of the first resin layer opposite to the substrate.

* * * * *